United States Patent [19]

Stokes

[11] Patent Number: 5,281,942
[45] Date of Patent: Jan. 25, 1994

[54] BOBBIN FOR AN ELECTRICAL WINDING AND METHOD OF MANUFACTURE

[75] Inventor: Rembert R. Stokes, Inverness, Ill.

[73] Assignee: Motorola Lighting, Inc., Buffalo Grove, Ill.

[21] Appl. No.: 719,216

[22] Filed: Jun. 21, 1991

[51] Int. Cl.⁵ ............................................. H01F 15/10
[52] U.S. Cl. ................................. 336/192; 24/356; 24/706; 336/198
[58] Field of Search ............... 336/192, 177, 222, 15, 336/196, 198; 163/3; 24/706, 13, 356-368, 706.1-706.9, 708.8, 708.9, 711.5; 223/109 R; 248/309.2

[56] References Cited

U.S. PATENT DOCUMENTS

| | | | |
|---|---|---|---|
| 3,858,281 | 1/1975 | Larson | 24/598.1 |
| 4,009,461 | 2/1977 | Usry | 336/197 |
| 4,530,812 | 7/1985 | Perkins et al. | 336/177 X |
| 4,568,903 | 2/1986 | Buculey | 336/197 |
| 4,813,979 | 3/1989 | Miller et al. | 55/25 |
| 4,938,768 | 7/1990 | Wu | 623/16 |
| 5,060,365 | 10/1991 | Lanzo | 29/739 |
| 5,116,325 | 5/1992 | Paterson | 604/192 |
| 5,158,709 | 10/1992 | Setti | 252/512 |
| 5,169,347 | 12/1992 | Sang | 29/739 X |
| 5,188,547 | 2/1993 | Dixon et al. | 439/886 |

Primary Examiner—Leo P. Picard
Assistant Examiner—Christopher Horgan
Attorney, Agent, or Firm—J. Ray Wood

[57] ABSTRACT

A transformer or inductor bobbin (2) having pins (24) of a rectangular cross-section with complementarily profiled ends (24A, 24B), of which one (24A) is tapered and the other (24B) has a recess (24E). The rectangular cross-section allows the pins to offer greater resistance to bending in the direction of their cross-section's greater dimension (for pulling winding wire from the pins), while offering easier bending in the direction of their cross-section's greater dimension (for clinching to a printed circuit board). The use of pins having complementary profiles at their opposite ends allows the pins to be separated simply and efficiently from a length of material with no material wastage, and the provision of a taper at one end of a pin and a recess at the other end allows easy insertion of the tapered end into a preformed printed circuit board hole while the recessed end provides for collection of scraped material during pin insertion into an undersized hole (22) in the bobbin. The undersized hole (22) is open at its top, allowing "out-gassing" of otherwise trapped air during soldering.

19 Claims, 8 Drawing Sheets

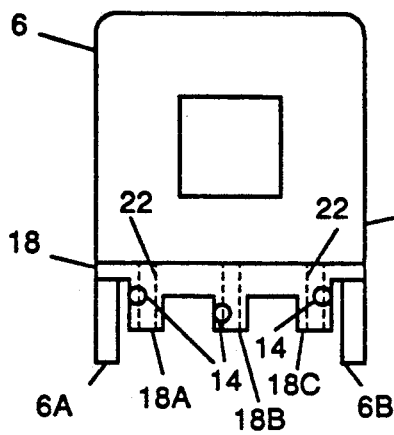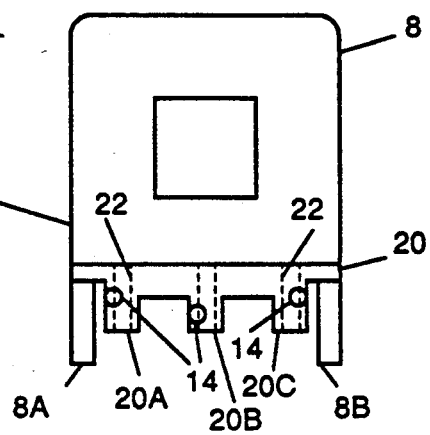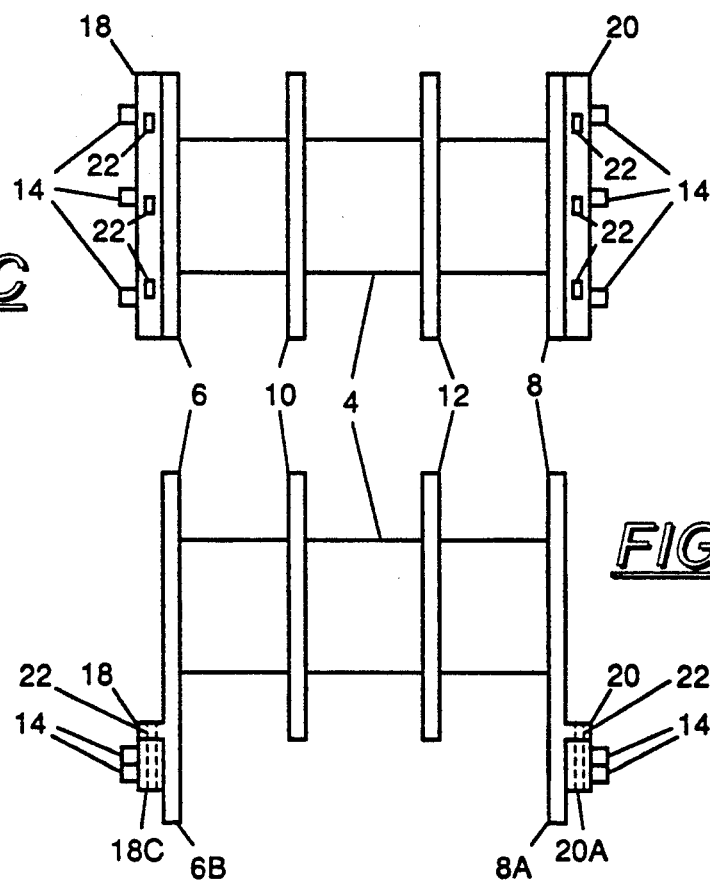

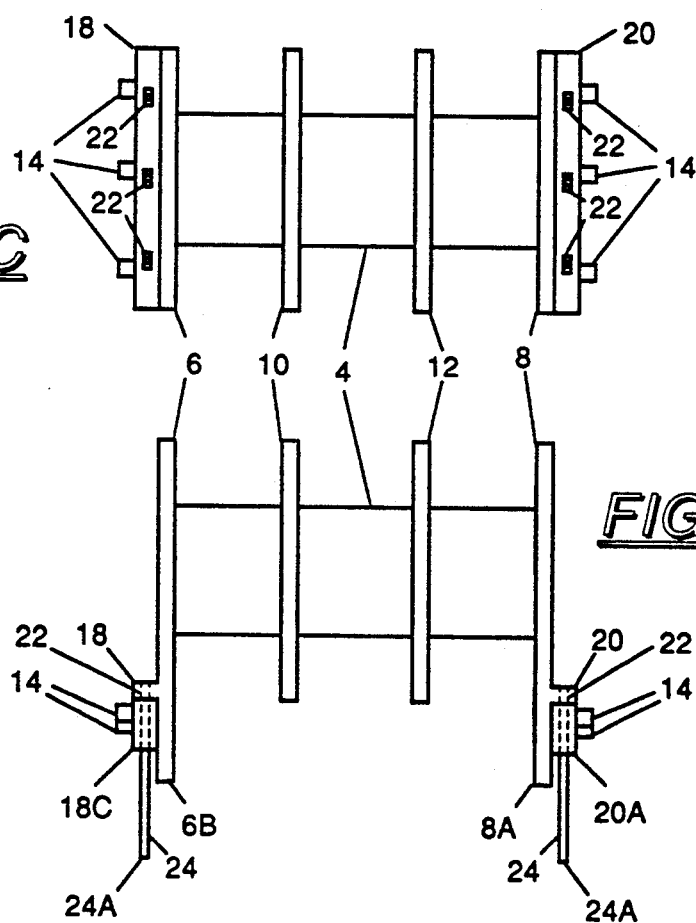

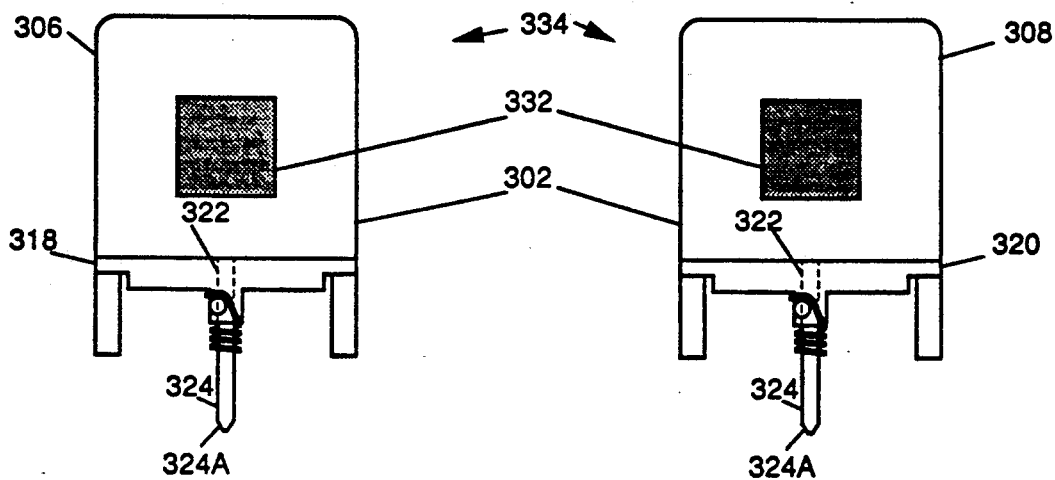

BOBBIN FOR AN ELECTRICAL WINDING AND METHOD OF MANUFACTURE

FIELD OF THE INVENTION

This invention relates to bobbins for electrical windings. Such bobbins are used to support the electrical windings and terminals of electrical components such as inductors and transformers.

BACKGROUND OF THE INVENTION

In a typical transformer or inductor a non-conductive body supports an electrical winding, and conductive pins are embedded in the body. The pins are connected to the winding, and at one of their ends the pins extend from the body to form external connection terminals (e.g., for insertion in and soldering to a printed circuit board).

The pins are typically inserted in the bobbin body by forcing them into undersized pre-formed holes, and the winding is typically connected to a pin by the winding wire being wound around the pin and then pulled laterally away from the pin so as to tension the wire to the point at which it breaks. In order to withstand such an operation, the pin must be sufficiently wide so as not to bend significantly as the wire is pulled away. Conversely, the pins must typically be sufficiently pliable to allow the ends extending from the bobbin body to be bent after insertion into a printed circuit board to ensure retention. Pins which are typically made of material having a symmetrical cross-section (e.g., round or square wire) cannot accommodate the conflicting requirements of being large enough to accommodate the wire-pulling stress, but pliable enough to allow the pins to be bent for retention after insertion.

Stamped terminals having an asymmetrical cross-section may be used to resolve these conflicting requirements, but such stamped terminals typically cost between five and ten times as much as such pins.

SUMMARY OF THE INVENTION

In accordance with a first aspect of the invention there is provided a pin for insertion in a bobbin for an electrical winding, the pin comprising:

a first end having a taper profile which aids insertion of the first end into a hole; and a second end for insertion into the bobbin, the second end having a profile substantially complementary to that of the first end and defining a recess therein.

Since the first and second ends have profiles which are complementary, the pins can be separated (e.g., stamped or cut) continually from a length of pin material (e.g., a ribbon wire) with no waste of material: a pin is separated from the length of material along a separation line which gives the desired profile to one end of the separated pin and leaves the complementary desired profile at the end of the length of material from which the next pin will be separated.

Also, the recess defined by the complementary profile of the second end serves to collect debris which may be scraped from the bobbin when the second end of the pin is forced into an undersized hole in the bobbin. By providing a collection space for such debris, the possibility of interference of the debris with the accurate location of the second end of the pin in the bobbin is reduced, aiding accurate location of the pin in the bobbin.

Preferably, the pins have a cross-section with a greater width in a first direction than in a perpendicular second direction (e.g., a rectangular cross-section), providing the pins with greater resistance to bending in the first direction and lesser resistance to bending in the second direction.

In accordance with a second aspect of the invention, there is provided a bobbin for an electrical winding and including a pin inserted in an undersized hole in the bobbin, the pin comprising:

a first end having a taper profile which aids insertion of the first end into a hole in an external component; and a second end forced into the undersized hole in the bobbin, the second end having a profile substantially complementary to that of the first end and defining a recess therein for collection of debris when the second end is forced into the undersized hole. Debris is formed from scrapings or shavings of the bobbin material as the pin broaches the undersized hole.

In accordance with a third aspect of the invention, there is provided a method of making a pin for insertion in a bobbin for an electrical winding, the method comprising:

providing a length of pin material;

separating a pin from an end of the length of pin material along a separation line which on one side thereof defines a taper profile for aiding insertion of the separated pin into a hole, and on an opposite side thereof defines a complementary profile forming a recess for collecting debris when the separated pin is inserted into the bobbin.

In accordance with a fourth aspect of the invention, there is provided a method of making a bobbin for an electrical winding, the method comprising:

providing a pin having:

a first end with a taper profile which aids insertion of the first end into a hole; and a second end with a profile substantially complementary to that of the first end and defining a recess therein;

providing a bobbin having therein an undersized hole relative to the pin;

inserting the second end of the pin into the undersized hole.

BRIEF DESCRIPTION OF THE DRAWINGS

Three transformers and one inductor, and their methods of manufacture, in accordance with the present invention will now be described, by way of example only, with reference to the accompanying drawings, in which:

FIGS. 1A, 1B, 1C, and 1D show respectively elevational views of opposite ends, a plan view from above, and an elevational view of a side, of a first bobbin for use in a first transformer;

FIGS. 4A, 4B, 4C, and 4D show respectively elevational views of opposite ends, a plan view from above, and an elevational view of a side, of the first bobbin at an intermediate stage of manufacture in which pins have been inserted;

FIGS. 8A, 8B, 8C, and 8D show respectively elevational views of opposite ends, a plan view from above, and an elevational view of a side, of an inductor incorporating a fourth bobbin;

DESCRIPTION OF THE PREFERRED EMBODIMENT

Figure 2:
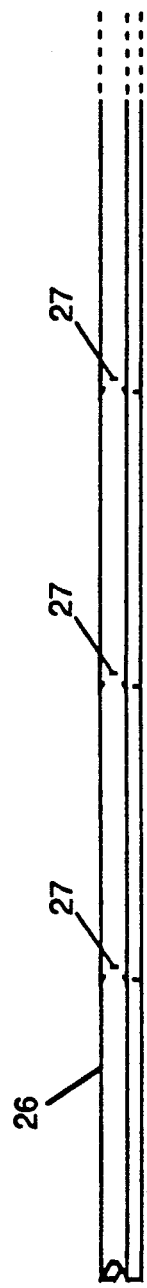
FIG. 2 shows a perspective view of a length of material from which pins for the first bobbin are separated.

Referring now to FIG. 1, a first bobbin 2 has a body 16 with a longitudinal, hollow portion 4 having a generally square cross-section. The hollow portion 4 has at each end thereof a generally square flange plate 6 and 8 respectively. The hollow portion 4 also has generally square intermediate flange plates 10 and 12 positioned equidistantly between the end flange plates 6 and 8. The body 3 is formed as a single piece molding of plastics material.

The end flange plates 6 and 8 are each provided at opposite ends of their bottom edges with two downwardly extending feet 6A & 6B and 8A & 8B respectively. The end flange plates 6 and 8 are also each provided along the length of their bottom edges with a shoulder or pin rail 18 and 20 respectively. The shoulders 18 and 20 extend outwardly in opposite directions parallel to each other and perpendicular to the length of the portion 4. Each of the shoulders 18 and 20 has three columnar portions 18A, 18B & 18C and 20A, 20B & 20C respectively spaced along the length of the shoulder and extending downwardly therefrom. Each of the columnar portions 18A, 18B & 18C and 20A, 20B & 20C has a post 14 respectively associated therewith, the posts of each shoulder extending outwardly in opposite directions parallel to the length of the portion 4.

Each of the columnar portions 18A, 18B & 18C and 20A, 20B & 20C has extending vertically within it a hole 22. The holes 22 extend from the bottom surface of the columnar portions through the top surface of the shoulder 18, 20 and have for most of their lengths rectangular cross-sections of similar proportion to, but undersized compared with, pins to be described. The holes 22 have at their bottoms a wider cross-section forming a bevel (not shown) to aid insertion into the hole and have at their tops a narrower cross-section forming a vent (also not shown) to allow "out-gassing" from the hole, as will be described below.

Figure 3:
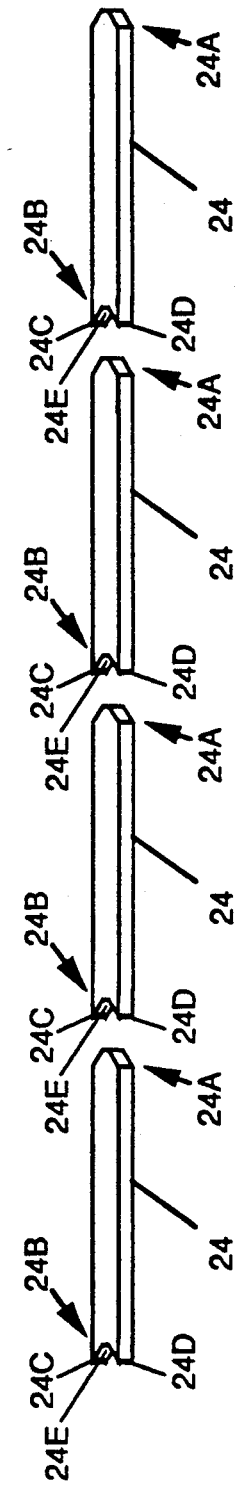
FIG. 3 shows a perspective view of pins separated from the length of material shown in FIG. 2.

Referring now to FIG. 2 and FIG. 3, pins 24 are formed from a length 26 of ribbon wire of metal alloy material having a rectangular cross-section approximately 0.018" by 0.050". The pins each have a length of approximately 0.430" and are formed by separating them continually from the end of the length of ribbon wire 26 by shearing along a separation line 27 (shown in FIG. 2 in dotted-line form). The separation of the pins from the length of ribbon wire material 26 is conveniently performed by shearing (vertically as seen in FIG. 2) the pins from the ribbon wire using a shearing tool (not shown), with a cutting edge in the shape of the separation line, to shear each pin from the length of ribbon wire along the separation line.

Thus, as each pin 24 is sheared from the length of ribbon wire 26, the newly-separated end of the pin is given a profile in the shape of the separation line, and the newly formed end of the ribbon wire 26 is given a complementary profile. The complementarily profiled end of the length of ribbon wire is then used as the end of the next-separated pin. The length of ribbon wire is then advanced a distance of approximately 0.430", inserted into the bobbin, and the shearing operation is repeated, separating the next pin 24 along the same shape of separation line. In this way each pin 24 is thus formed with complementarily profiled ends 24A and 24B. As can be seen from the drawings, the separation line is shaped so as to impart to one end of each pin a profile 24A having a truncated taper, while at the same imparting to the pin's other end a profile 24B formed by two pointed "ear-shaped" limbs 24C and 24D which define therebetween a recess 24E. The purpose and function of the complementary profiles 24A and 24B will be explained and discussed below.

It will be appreciated that by forming the pins 24 in this way from the length of ribbon wire 26 with complementarily profiled ends, the pins are produced simply and efficiently, with no wastage of material, since the profile given to the remaining end of the ribbon wire when a pin is separated therefrom is used as the profile of an end of the next pin to be separated.

Referring now also to FIGS. 4A-D, six of the pins 24 are inserted (as mentioned above, as part of the process by which the pins are formed from the ribbon wire 26) respectively into the holes 22 in the columnar portions 18A, 18B & 18C and 20A, 20B & 20C in the shoulders or rails 18 and 20. As mentioned above, the holes 22 have for most of their lengths the same rectangular cross-sectional shape as the pins 24 but are undersized compared therewith. The plastics material of the body 16 is sufficiently flexible to allow the pins 24 to be forced, with an interference fit, into the holes 22. The profiled ends 24B of the pins 24 are inserted into the bevelled lower ends of the holes 22 and the pins are forced vertically upward by approximately 0.2" until they stop at the holes' narrower vent portions, leaving the profiled ends 24B enclosed within the holes 22 and leaving the pins extending exposed below the lower surface of the shoulders 18 and 20 for a depth of approximately 0.230" until they terminate at their profiled ends 24A. For reasons which will be explained below, the pins are aligned with respect to the shoulders 18 and 20 with the pins' larger cross-sectional dimension extending along the length of the rails 18 and 20, i.e., in the plane of FIGS. 4A and 4B.

It will be understood that, as the profiled ends 24B of the pins 24 are forced upward in the holes 22, a certain amount of material is typically scraped or shaved from the inner surface of each hole 22. The debris formed by this scraped material is prevented from impeding further upward movement of the pins 24 in the holes 22 by the presence of the recess 24E in the each of the profiled ends 24B. The recess 24E in each of the profiled ends 24B acts as a collection area for the debris of scraped material, and so prevents the debris from impeding further upward movement of the pins 24 in the holes 22, as would occur with a conventional flat-topped pin, and allows the pins 24 to be positioned accurately within the holes 22.

Figure 5A:
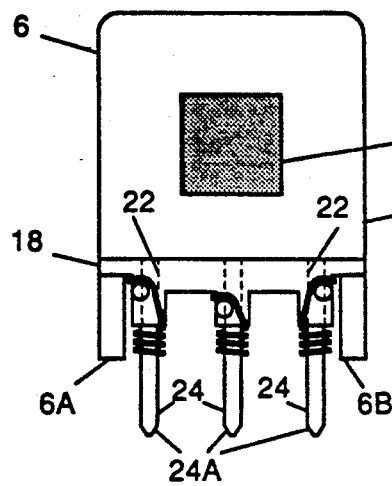
FIGS. 5A, 5B, 5C, and 5D show respectively elevational views of opposite ends, a plan view from above, and an elevational view of a side, of the first transformer incorporating the first bobbin.
Figure 5B:
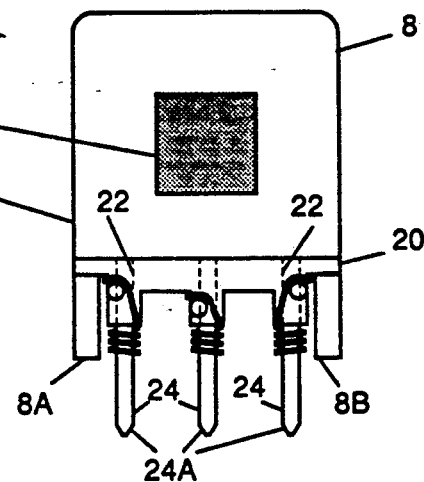
Figure 5C:
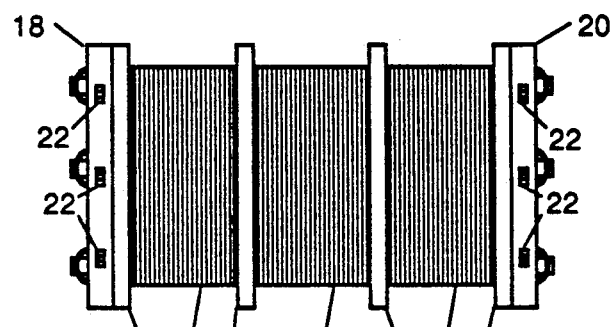
Figure 5D:
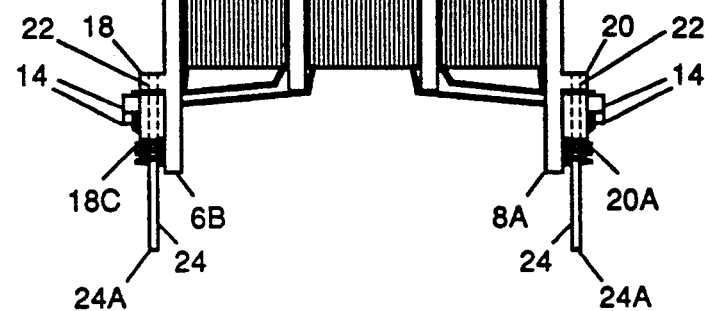
Figure 6A:
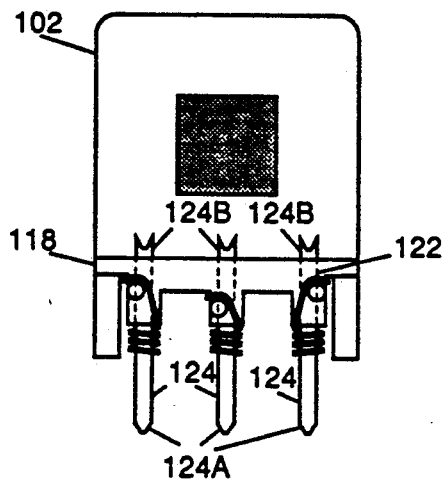
FIGS. 6A, 6B, 6C, and 6D show respectively elevational views of opposite ends, a plan view from above, and an elevational view of a side, of a second transformer incorporating a second bobbin.
Figure 6B:
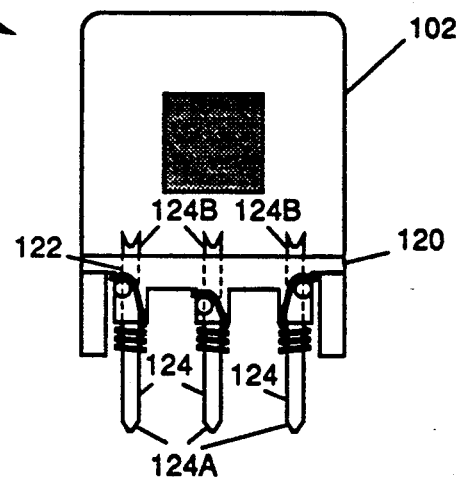
Figure 6C:
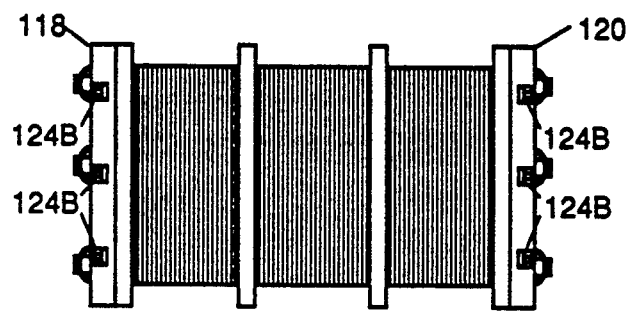
Figure 6D:
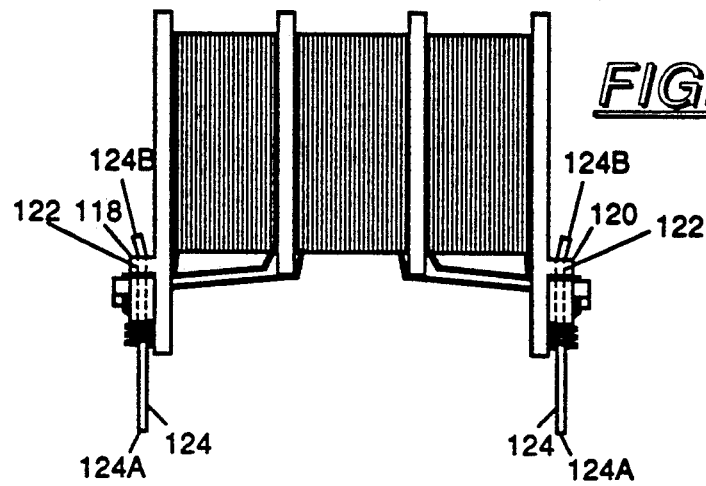
Figure 7A:
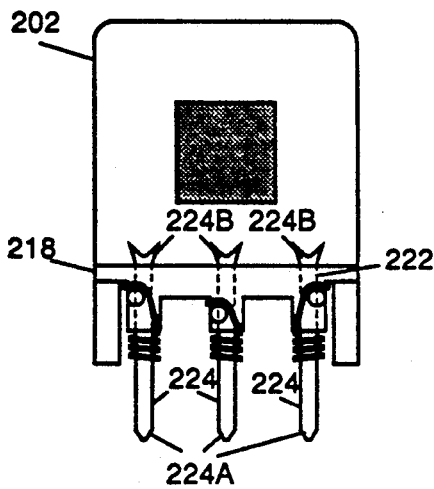
FIGS. 7A, 7B, 7C, and 7D show respectively elevational views of opposite ends, a plan view from above, and an elevational view of a side, of a third transformer incorporating a third bobbin.
Figure 7B:
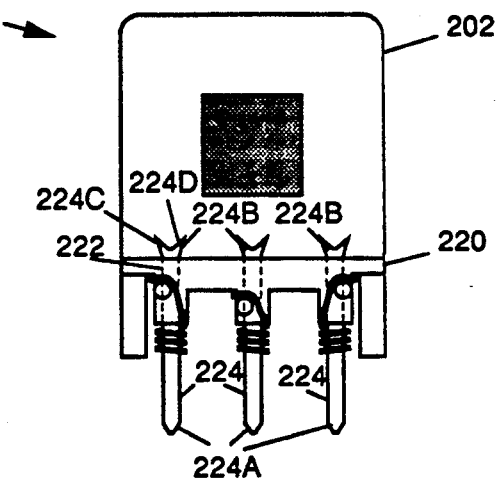
Figure 7C:
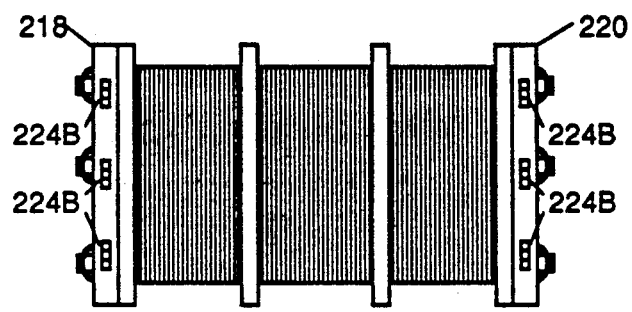
Figure 7D:
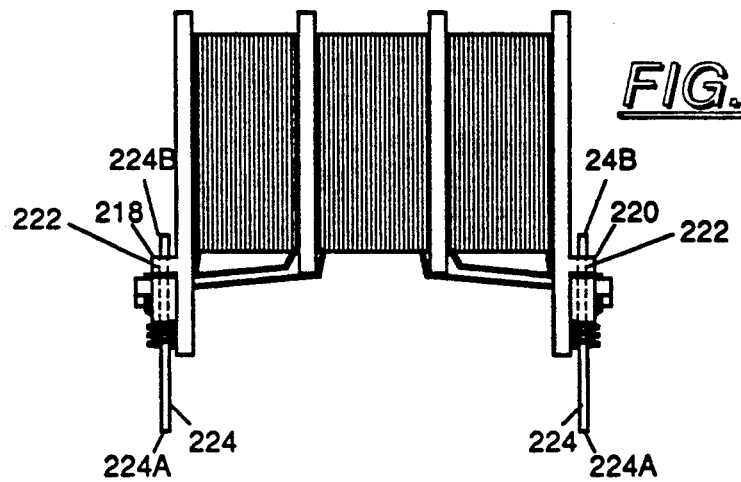

Referring now also to FIGS. 5A-D, with the pins 24 positioned in the holes 22 as shown in FIGS. 4A-D, individual wire windings 26, 28 and 30 are then wound around the hollow portion 4 in the plane of FIGS. 5A and 5B, the winding 26 being wound in the space between the flange plates 6 and 10, the winding 28 being wound in the space between the flange plates 10 and 12, and the winding 30 being wound in the space between the flange plates 12 and 8. The inner winding 28 may be used, for example, as a primary winding and the outer windings 26 and 30 may be used as secondary windings. The windings 26, 28 and 30 are each produced by first winding wire at least three times around the exposed portion of a respective one of the pins 24 immediately beneath the lower surface of the shoulder 18 or 20. The wire is then wound over a respective post 14, for strain relief, and wound around the hollow portion 4 in the relevant space between the flange plates 6, 8, 10 and 12. Lastly the wire is wound over the post 14 associated with a further respective one of the pins 24, for strain relief, and then wound at least three times around the exposed portion of the associated pin 24 immediately beneath the lower surface of the shoulder 18 or 20. The wire is finally pulled laterally away from the pin in the plane of FIGS. 5A and 5B until the tension in the wire exceeds the breaking strength of the wire, at which point the wire breaks, leaving the winding complete as shown in FIGS. 5A-D. It will be appreciated that since the wire is pulled away from the pins 24 in the direction of the pins' larger cross-sectional dimension, the pins accommodate the stress to which they are subjected without bending.

With the windings 26, 28 and 30 complete as shown in FIGS. 5A-D, the bobbin is then dipped into a molten solder bath (not shown) to a depth of just less than 0.230", so as to burn off the wire's insulation and to cover the exposed portions of the pins 24 and the turns of wire winding around the pins immediately below the shoulders 18 and 20. The bobbin is then removed from the solder bath and the solder adhering to the bobbin is allowed to solidify, thus forming a soldered connection between the windings 26, 28 and 30 and their respective pins 24. Lastly, a core 32 is inserted into the bobbin's hollow portion 4 and secured with spring clips (not shown) to complete a transformer 34 with the pins 24 forming the transformer's external connections.

It will be understood that, since the holes 22 extend to the top surfaces of the shoulders 18 and 20, when the windings 26, 28 and 30 are soldered to the pins 24, "out-gassing" of air above the pins 24 in the holes occurs, preventing the air, which would otherwise be trapped, from expanding and forcing the pins 24 out of the holes 22.

In use the transformer 34 is typically connected to other electronic components on a printed circuit board (not shown), the external connection pins 24 being inserted in and extending through pre-formed holes in the printed circuit board, and the feet 13 & 14 and 15 & 16 of the bobbin resting on the surface of the printed circuit board and spacing therefrom the bobbin windings. It will be understood that the tapering of the exposed lower ends of the pins 24 facilitates insertion of the pins in the printed circuit board's pre-formed holes.

After insertion the external connection pins 24 which extend through the printed circuit board's pre-formed holes are crimped so as to clinch the transformer and it in place in the printed circuit board. The external connection pins 24 which extend through the printed circuit board's pre-formed holes are bent in the direction of the pins' shorter cross-sectional dimension, i.e., in the plane of FIG. 5D, allowing the pins to be bent easily.

In summary therefore, it will be appreciated that the bobbin 2 and the transformer 34 offer a number of advantages in manufacture and use:

(i) the use of pins having a rectangular cross-section allows the pins to offer greater resistance to bending in the direction of their cross-section's greater dimension (for pulling winding wire from the pins), while offering easier bending in the direction of their cross-section's lesser dimension (for retaining the transformer in a printed circuit board);

(ii) the use of pins having with complementary profiles at their opposite ends allows the pins to be separated simply and efficiently from a length of material with no material wastage, and the provision of a taper at one end of a pin and a recess at the other end allows easy insertion of the tapered end into a pre-formed printed circuit board hole while the recessed end provides for collection of scraped material during pin insertion; and (iii) the use of an open hole in which the pin is inserted allows "out-gassing" of otherwise trapped air during soldering, and prevents the expansion of trapped air from pushing out the pins.

Referring now to FIG. 6, a second transformer 134 incorporates a second bobbin 102 which is similar to, and is manufactured in a similar way to, the first bobbin already described, and will be explained only so far as to make clear the difference therebetween. In the second bobbin 102, pins 124 are of the same general profile as and are made in the same way as the pins 24 in the first bobbin 2. However, the pins 124 are slight longer than the pins 24 and whereas in the first bobbin the profiled ends 24B of the pins 24 are enclosed within the holes 22, in the second bobbin the pins' upper ends 124B extend out of the upper ends of holes 122 in rails 118 and 120 of the bobbin. The extending upper ends of the pins 124 are bent outwardly (in the plane of FIG. 6D) so as to retain the pins. It will be understood that in all other respects the second bobbin is identical to the first bobbin and offers the same advantages of (i) the use of pins having a rectangular cross-section allowing the pins to offer greater resistance to bending in the direction of their cross-section's greater dimension (for breaking winding wire on the pins), while offering easier bending in the direction of their cross-section's lesser dimension; and (ii) the use of pins having complementary profiles at their opposite ends allowing the pins to be separated simply and efficiently from a length of material with no material wastage, and the provision of a taper at one end 124A of a pin allowing easy insertion of the tapered end into a pre-formed printed circuit board hole.

Referring now to FIG. 7, a third transformer 234 incorporates a third bobbin 202 which is similar to, and is manufactured in a similar way to, the first bobbin already described, and will be explained only so far as to make clear the difference therebetween. In the third bobbin 202, pins 224 are the same as and are made in the same way as the pins 24 in the first bobbin 2. However, whereas in the first bobbin the profiled ends 24B of the pins 24 are enclosed within the holes 22, in the second bobbin the pins, upper ends 224B extend out of the upper ends of holes in the shoulders 218 and 220 of the bobbin. The extending upper ends of the pins 224 have their ear-shaped limbs 224C and 224D bent away from each other in the plane of FIGS. 7A and 7B. The ear-shaped limbs of the upper ends of the pins 224 may, for example, be bent away from each other by forcing the upper end of the pin, as it is inserted, against an anvil (not shown) to force the ears apart. In will be understood that in all other respects the second bobbin is identical to the first bobbin and offers the same advantages as the second bobbin of (i) the use of pins having a rectangular cross-section allowing the pins to offer greater resistance to bending in the direction of their cross-section's greater dimension (for breaking winding wire on the pins), while offering easier bending in the direction of their cross-section's lesser dimension; and (ii) the use of pins having with complementary profiles at their opposite ends allowing the pins to be separated simply and efficiently from a length of material with no material wastage, and the provision of a taper at one end 224A of a pin allowing easy insertion of the tapered end into a pre-formed printed circuit board hole.

It will be understood that although the invention has been described above with respect to bobbins for transformers, the invention is not limited to bobbins for transformers, and can alternatively be applied to bobbins for electrical windings for other electrical components such as, for example, inductors.

Referring now to FIGS. 8A-D, an inductor 334 includes a fourth bobbin 302. The bobbin 302 is similar to, and is manufactured in a similar way to, the first bobbin described above. The bobbin 302 differs from the first bobbin 2 only in that it has two pins 324, identical to the pins 24, respectively embedded in rails 318 and 320 on flange plates 306 and 308 at opposite ends of the bobbin, and in that the bobbin supports only a single winding 326 between the flange plates 306 and 308. The pins 324 are embedded in the holes 322 through the body 304 in the same way as in the first bobbin 2, and the winding 326 is wound on the bobbin and connected to the two pins 324 in the same way as the windings 26, 28 and 30 of the first bobbin 2. Finally, the bobbin 302 is soldered and has a core 332 inserted in the bobbin 302 in the same way as the first bobbin 2.

It will be understood that the fourth bobbin 302 is in all other respects identical to the first bobbin and offers the same advantages of (i) the use of pins having a rectangular cross-section allowing the pins to offer greater resistance to bending in the direction of their cross-section's greater dimension (for breaking winding wire on the pins), while offering easier bending in the direction of their cross-section's lesser dimension; and (ii) the use of pins having complementary profiles at their opposite ends allowing the pins to be separated simply and efficiently from a length of material with no material wastage, and the provision of a taper at one end 324A of a pin and a recess at the other end allows easy insertion of the tapered end into a pre-formed printed circuit board hole while the recessed end provides for collection of scraped material during pin insertion and prevents insertion depth variation; and (iii) the use of an open hole in which the pin is inserted allows "out-gassing" of otherwise trapped air during soldering.

Figure 9:
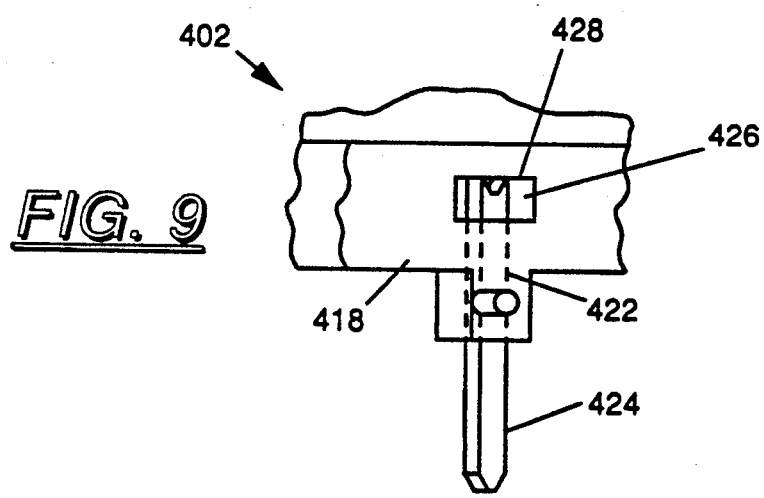
FIG. 9 shows a perspective view of part of a fifth bobbin having an alternative shoulder arrangement to the first, second, third and fourth bobbins.

Referring now to FIG. 9, a fifth bobbin 402 is generally similar to the first, second, third and fourth bobbins described above, and is illustrated and will be described only in so far as to make clear its differences therefrom. Like the earlier described bobbins, the fifth bobbin 402 has in its shoulder or rail 418 a rectangular cross-section hole 422 extending vertically upward from the rail's lower surface, the hole being undersized relative to pin 424 which is forced up into the hole. Unlike the earlier described bobbins, the fifth bobbin 402 has in the side of its rail 418 a rectangular recess 426, and the hole 422 (instead of extending to the top surface of the rail as in the earlier described bobbins) extends into and terminates at the recess 426.

In manufacture of the bobbin 402 the recessed upper end of the pin 424 is inserted into the lower end of the hole 422 and is forced upwardly in the hole. As the pin 424 progresses upwardly through the hole 422, the pin's upper end clears the top of the hole and enters the recess 426. The pin's upper end moves upwardly in the recess 426 until it abuts the recess's upper surface 428. A tool (not shown) is then inserted into the recess 426 to crimp the pin's upper end so as to prevent downward movement of the pin.

Thus, it will be appreciated that the recess's upper surface 428 provides a positive stop for the pin 424, providing accurate vertical location of the pin in the bobbin and preventing further upward movement of the pin, while the crimping of the pin's upper end prevents further downward movement of the pin. It will also be appreciated that in the arrangement of FIG. 9, since the upper end of the hole 422 opens into the recess 426, the possibility of "out-gassing" forcing the pin downward during soldering is eliminated.

Figure 10:
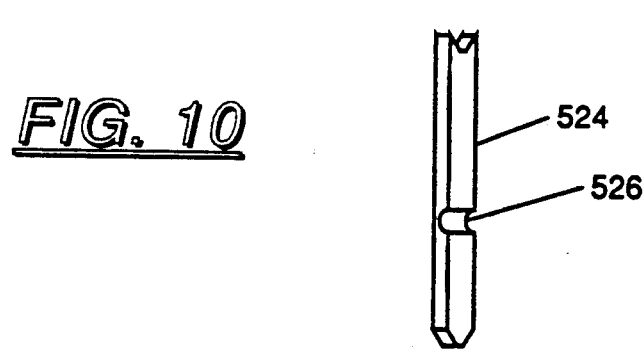
FIG. 10 shows a perspective view of an alternative pin which may be used in the first, second, third, fourth or fifth bobbin.

Referring now to FIG. 10, a pin 524, alternative to the pins of FIGS. 2-9, is of generally the same form as the previous pins, and is made from ribbon wire in the same way. The pin 524 differs from the previous pins 24, 124, 224, 324 and 424 only in that the pin 524 additionally has a lateral groove 526 formed in one of its wider sides at a position at which the pin will be crimped to retain it in a printed circuit board (not shown). It will be understood that the groove 526 further reduces the pin's stiffness to bending in addition to the reduction produced by the pin being of asymmetric cross-section. The groove 526 is conveniently formed in the pin by swaging the pin as part of the same operation in which the pin is sheared from the ribbon wire. It will be understood that the cutting tool (not shown) used to separate the pins from the ribbon wire may conveniently have a formation thereon to perform the swaging simultaneously with the separation of pins from the ribbon wire.

It will be appreciated that in the above described embodiments, the pins 24, 124, 134, 144 and 154 provide the advantages of stamped terminals at a much lower cost.

It will also be understood that the pins 24, 124, 134, 144 and 154 may, if desired, be "gang" inserted, (i.e. in each bobbin all the required pins may inserted simultaneously using an appropriate multiple-insertion tool—not shown), increasing insertion speed and lowering manufacturing cost.

It will also be appreciated that various other modifications or alternatives to the above described embodiments will be apparent to the person skilled in the art without departing from the inventive concept.

I claim:
1. A pin for insertion in a bobbin for an electrical winding, the pin comprising:
   a first end having a taper profile which aids insertion of the first end into a hole; and
   a second end for insertion into the bobbin, the second end having a profile substantially complementary to that of the first end and defining a recess therein.

2. A pin according to claim 1 wherein the taper profile of the first end is a truncated taper from opposite sides of the first end and the profile substantially complementary to the first profile defines two limbs at opposite sides of the second end and the recess therebetween.

3. A pin according to claim 1 wherein the pin is of asymmetric cross-section having a greater width in a first direction than in a second direction perpendicular thereto.

4. A pin according to claim 3 wherein the pin is of rectangular cross-section.

5. A pin according to claim 3 wherein the pin is formed by separation from a length of material along a separation line defining the taper profile and the profile substantially complementary thereto.

6. A pin according to claim 5 wherein the pin is formed by shearing from the length of material.

7. A pin according to claim 1 wherein the pin is of formed of ribbon wire.

8. A pin according to claim 1 having a region of reduced thickness for aiding bending thereat.

9. A pin according to claim 1 wherein the region of reduced thickness is formed by swaging.

10. A bobbin for an electrical winding and including a pin inserted in an undersized hole in the bobbin, the pin comprising:
    a first end having a taper profile which aids insertion of the first end into a hole in an external component; and
    a second end forced into the undersized hole in the bobbin, the second end having a profile substantially complementary to that of the first end and defining a recess therein for collection of debris when the second end is forced into the undersized hole.

11. A bobbin according to claim 10 wherein the bobbin has a first surface and a second surface and wherein the hole in the bobbin extends from the first surface to the second surface.

12. A bobbin according to claim 10 wherein the bobbin has a first surface and has a recess therein and wherein the hole in the bobbin extends from the first surface to the recess.

13. A bobbin according to claim 10 wherein the bobbin is adapted to support a winding for an inductor.

14. A bobbin according to claim 10 wherein the bobbin is adapted to support a plurality of windings for a transformer.

15. A method of making a bobbin for an electrical winding, the method comprising:
    providing a pin having:
        a first end with a taper profile which aids insertion of the first end into a hole; and
        a second end with a profile substantially complementary to that of the first end and defining a recess therein;
    providing a bobbin having therein an undersized hole relative to the pin;
    inserting the second end of the pin into the undersized hole;

16. A method according to claim 15 wherein the second end of the pin extends from the undersized hole and the method further comprises crimping the second end of the pin to prevent removal of the pin from the undersized hole.

17. A method according to claim 16 wherein the step of crimping comprises bending the second end of the pin to one side.

18. A method according to claim 16 wherein the second end of the pin has two limbs on opposite sides thereof and the step of crimping comprises bending apart the two limbs.

19. An electrical winding assembly having a bobbin supporting the electrical winding and including a pin inserted in an undersized hole in the bobbin, the pin being of asymmetric cross-section having a greater width in a first direction than in a second direction perpendicular thereto and comprising:
    a first end having a taper profile which aids insertion of the first end into a hole in an external component; and
    a second end forced into the undersized hole in the bobbin, the second end having a profile substantially complementary to that of the first end and defining a recess therein for collection of debris when the second end is forced into the undersized hole.

* * * * *